US009118160B2

(12) United States Patent
Park et al.

(10) Patent No.: US 9,118,160 B2
(45) Date of Patent: Aug. 25, 2015

(54) VCSEL AND MANUFACTURING METHOD OF THE SAME

(71) Applicant: Electronics and Telecommunications Research Institute, Daejeon (KR)

(72) Inventors: Hyundai Park, Daejeon (KR); Gyungock Kim, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 14/195,778

(22) Filed: Mar. 3, 2014

(65) Prior Publication Data

US 2014/0348194 A1 Nov. 27, 2014

(30) Foreign Application Priority Data

May 24, 2013 (KR) .................. 10-2013-0059190
Sep. 23, 2013 (KR) .................. 10-2013-0112714

(51) Int. Cl.
*H01S 5/02* (2006.01)
*H01S 5/042* (2006.01)
*H01S 5/183* (2006.01)

(52) U.S. Cl.
CPC ............. *H01S 5/0218* (2013.01); *H01S 5/0422* (2013.01); *H01S 5/18308* (2013.01); *H01S 5/021* (2013.01); *H01S 5/0215* (2013.01)

(58) Field of Classification Search
CPC ..... H01S 5/021; H01S 5/0215; H01S 5/0216; H01S 5/0217; H01S 5/18; H01S 5/183; H01S 5/18308; H01S 5/18311; H01S 5/18313; H01S 5/18344; H01S 5/18347; H01S 5/1835

USPC ..................................................... 372/50.124
See application file for complete search history.

(56) References Cited

U.S. PATENT DOCUMENTS

| 5,128,951 | A  | * | 7/1992  | Karpinski ............... 372/50.12 |
| 7,388,230 | B1 | * | 6/2008  | Lebby et al. .................. 257/89 |
| 7,399,124 | B2 |   | 7/2008  | Deng |
| 8,313,962 | B2 | * | 11/2012 | Lott et al. ..................... 438/26 |
| 2002/0031890 | A1 | * | 3/2002 | Watanabe et al. ............ 438/296 |
| 2009/0003401 | A1 | * | 1/2009 | Sekiguchi ............... 372/50.124 |
| 2011/0176567 | A1 | * | 7/2011 | Joseph ........................ 372/36 |

FOREIGN PATENT DOCUMENTS

KR  10-0493148 B1  8/2005
KR  10-0627703 B1  9/2006

OTHER PUBLICATIONS

Y. Xiong et al., "Oxide-Defined GaAs Vertical-Cavity Surface-Emitting Lasers on Si Substrates", IEEE Photonics Technology Letters, Feb. 2000, pp. 110-112, vol. 12, No. 2.*
H. Fathollahnejad et al., "Vertical-cavity surface-emitting lasers integrated onto silicon substrates by PdGe contacts", Electronics Letters, Jul. 21, 1994, pp. 1235-1236, vol. 30, No. 15.

* cited by examiner

*Primary Examiner* — Xinning Niu

(57) ABSTRACT

Provided is a vertical-cavity surface-emitting laser (VCSEL). The VCSEL includes a silicon substrate, a lower reflective layer disposed on the silicon substrate, a light generation laser disposed on the lower reflective layer, and an upper reflective layer disposed on the light generation layer. The lower reflective layer, the light generation layer, and the upper reflective layer may include a III-V semiconductor light source-active layer monolithically integrated on a first impurity layer by wafer bonding.

12 Claims, 9 Drawing Sheets

VCSEL AND MANUFACTURING METHOD OF THE SAME

CROSS-REFERENCE TO RELATED APPLICATIONS

This U.S. non-provisional patent application claims priority under 35 U.S.C. §119 of Korean Patent Application Nos. 10-2013-0059190, filed on May 24, 2013, and 10-2013-0112714, filed on Sep. 23, 2013, the entire contents of which are hereby incorporated by reference.

BACKGROUND OF THE INVENTION

The present invention disclosed herein relates to a light source, and more particularly, to a vertical-cavity surface-emitting laser (VCSEL).

High-efficiency low-cost optoelectronic integrated circuits and silicon electric devices that drive the optoelectronic integrated circuits are required to integrate a laser light source based on silicon substrates. Since indirect bandgap materials such as silicon have low light generation efficiency, it is difficult to realize a light source formed of only silicon. Thus, laser light source chips are mounted on a silicon substrate as the following methods. That is, laser light source chips may be manufactured on a substrate formed of direct bandgap materials having superior light generation efficiency. Then, the laser light source chips may be flip-chip bonded on the silicon substrate. However, the typical methods of manufacturing the laser light source have low throughput per unit time in flip-chip processes of aligning and bonding the laser light source chips to reduce productivity. In addition, after the flip-chip bonding, a height difference between the individual light source chip and the silicon substrate may be about 100 µm or more. Thus, the typical methods of manufacturing the laser light source may have an additional difficulty in packaging processes including an electrical wiring process and the like.

SUMMARY OF THE INVENTION

The present invention provides a vertical-cavity surface-emitting laser (VCSEL) which is capable of improving productivity and a method of manufacturing the same.

The present invention also provides a VCSEL and manufacturing method of the same which has a conductive bonding interface having efficient electrical resistance characteristics.

Embodiments of the inventive concept provide vertical-cavity surface-emitting lasers (VCSELs) including: a silicon substrate; a lower reflective layer disposed on the silicon substrate; a light generation laser disposed on the lower reflective layer; and an upper reflective layer disposed on the light generation layer, wherein the lower reflective layer, the light generation layer, and the upper reflective layer include a III-V semiconductor light source-active layer monolithically integrated on the silicon substrate by wafer bonding.

In some embodiments, the silicon substrate may include: a bulk silicon layer; and a first impurity layer disposed on the bulk silicon layer, wherein the first impurity layer and the lower reflective layer may have a conductive bonding interface therebetween.

In other embodiments, the first impurity layer may include conductive impurities doped in the silicon substrate, wherein the lower reflective layer may have the same conductive type as that of the first impurity layer.

In still other embodiments, the VCSELs may further include a lower current aperture disposed between the first impurity layer and the lower reflective layer and disposed on an edge of the first impurity layer and lower reflective layer.

In even other embodiments, the lower current aperture may be doped with the first conductive type impurities and include a second impurity layer doped with the first conductive type impurities having a concentration lower than that of the first impurity layer.

In yet other embodiments, the light generation layer may include an upper current aperture disposed in an edge thereof between the lower reflective layer and the upper reflective layer.

In further embodiments, the upper current aperture may include an oxide or under cut.

In still further embodiments, the VCSELs may further include a bonding thin film layer between the first impurity layer and the lower reflective layer.

In even further embodiments, the bonding thin film layer may include a metal layer.

In yet further embodiments, the VCSELs may further include: a lower electrode disposed on the first impurity layer outside the lower reflective layer; and an upper electrode disposed on the upper reflective layer.

In other embodiments of the inventive concept, methods of manufacturing a VCSEL include: providing a silicon substrate; bonding a wafer including a III-V semiconductor substrate and a III-V semiconductor light source-active layer disposed on the III-V semiconductor substrate to the silicon substrate; removing the III-V semiconductor substrate; and removing the III-V semiconductor light source-active layer disposed on an edge of the silicon substrate to form a lower reflective layer, a light generation layer, and an upper reflective layer.

In some embodiments, the bonding of the wafer may include a surface activated bonding process or a hydrophobic direct bonding process.

In other embodiments, the patterning of the III-V semiconductor light source-active layer may include forming an upper current aperture on an edge of the light generation layer between the lower reflective layer and the upper reflective layer.

In still other embodiments, the providing of the silicon substrate may include forming a first impurity layer on a top surface of the silicon substrate.

In even other embodiments, the methods may further include forming a lower current aperture in an edge of the first impurity layer corresponding to a circumference of the lower reflective layer.

In yet other embodiments, the lower current aperture may include a second impurity layer doped with first conductive type impurities having a concentration higher than that of the first conductive type impurities doped into the first impurity layer.

In further embodiments, the bonding of the wafer may include providing a metal bonding layer between the silicon substrate and the III-V semiconductor light source-active layer.

BRIEF DESCRIPTION OF THE DRAWINGS

The accompanying drawings are included to provide a further understanding of the present invention, and are incorporated in and constitute a part of this specification. The drawings illustrate exemplary embodiments of the inventive concept and, together with the description, serve to explain principles of the present invention. In the drawings.

DETAILED DESCRIPTION OF PREFERRED EMBODIMENTS

Figure 1:
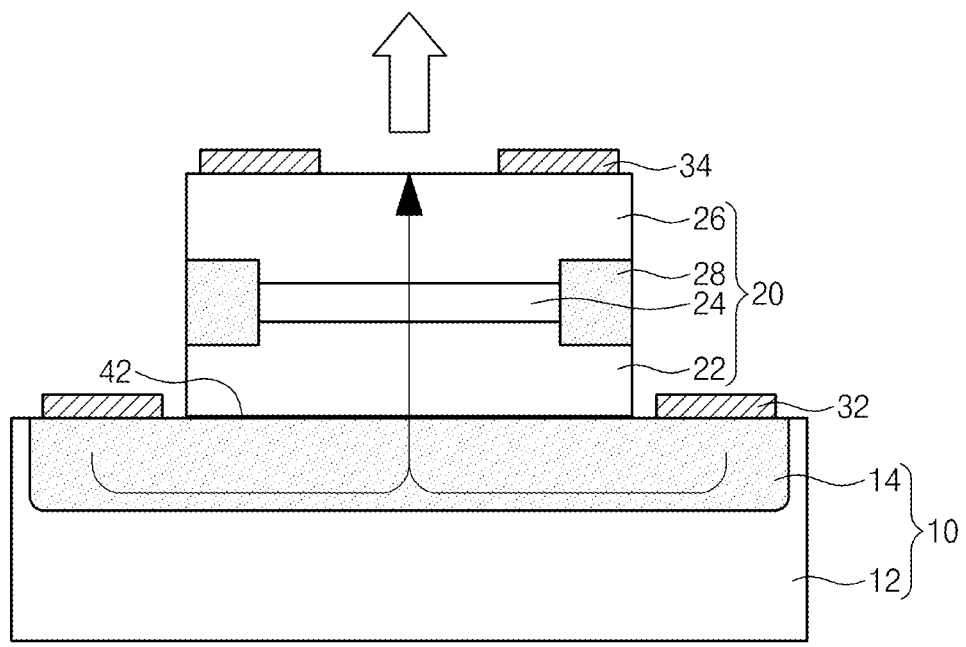
FIG. 1 is a cross-sectional view of a vertical-cavity surface-emitting laser (VCSEL) according to a first embodiment of the inventive concept.

Hereinafter, exemplary embodiments of the inventive concept will be described below in more detail with reference to the accompanying drawings. Advantages and features of the present invention, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto. It will be understood that when an element such as a layer, film, region, or substrate is referred to as being "on" another element, it can be directly on the other element or intervening elements may also be present.

(First Embodiment)

FIG. 1 illustrates a vertical-cavity surface-emitting laser (VCSEL) according to a first embodiment of the inventive concept. The VCSEL according to the first embodiment of the inventive concept may include a silicon substrate 10, a III-V semiconductor light source-active layer 20, and lower and upper electrodes 32 and 34.

The silicon substrate 10 may be a IV semiconductor substrate, e.g., a single crystal silicon wafer. The silicon substrate 10 may include a bulk silicon layer 12 and a first impurity layer 14. The first impurity layer 14 may be disposed in an upper portion of the bulk silicon layer 12. The first impurity layer 14 may be doped with first conductive type impurities. According to an embodiment of the inventive concept, the first conductive type impurities may include an acceptor. For example, the first conductive type impurities may include boron or gallium.

The III-V semiconductor light source-active layer 20 may be monolithically integrated on the silicon substrate 10 by wafer bonding. The III-V semiconductor light source layer 20 may have a mesa shape. The III-V semiconductor light source layer 20 may include a lower reflective layer 22, a light generation layer 24, an upper reflective layer 26, and an upper current aperture 28.

The lower reflective layer 22 may be disposed on the first impurity layer 14. The first impurity layer 14 and the lower reflective layer 22 may have a conductive bonding interface 42 therebetween. The conductive bonding interface 42 may have an ohmic contact resistance characteristic between the first impurity layer 14 and the lower reflective layer 22. The ohmic contact resistance characteristic may be defined as output current to a bias voltage is linearly expressed. The bias voltage may be provided between the first impurity layer 14 and the III-V semiconductor light source-active layer 20. The output current may flow from the first impurity layer 14 to the III-V semiconductor light source-active layer 20. The lower reflective layer 22 may include InP, AlGaAs, or InGaP that is doped with the first conductive type impurities.

The light generation layer 24 may be disposed on the lower reflective layer 22. The light generation layer 24 may include InGaAsP, InGaAlAs, AlGaAs, InAlAs, InGaP, GaAs, or InGaAs that has a quantum well structure and a quantum dot structure.

The upper reflective layer 26 may be disposed on the light generation layer 24. The upper reflective layer 26 may include InP, AlGaAs, or InGaP that is doped with second conductive type impurities. The second conductive type impurities may have a conductive type opposite to that of the first conductive type impurities. According to an embodiment of the inventive concept, the second conductive type impurities may be a donor. For example, the second conductive type impurities may include phosphorus or arsenic.

The upper current aperture 28 may be disposed on an edge of the light generation layer 24 between the lower and upper reflective layers 22 and 26. The upper current aperture 28 may include an oxide or under cut. The oxide may be formed by oxidizing an edge of the light generation layer 24. The under cut represents a portion at which the edge of the light generation layer 24 is reduced in area when compared to those of the upper and lower reflective layers 26 and 22.

An upper electrode 34 may be disposed on the upper reflective layer 26. A lower electrode 32 may be disposed on the first impurity layer 14 outside the lower reflective layer 22. Each of the lower and upper electrodes 32 and 34 may include a metal layer.

A method of manufacturing the VCSEL according to the first embodiment of the inventive concept will be described as follows.

FIGS. 2 to 6 are cross-sectional views illustrating a method of manufacturing the VCSEL on the basis of FIG. 1 according to the first embodiment of the inventive concept.

Figure 2:
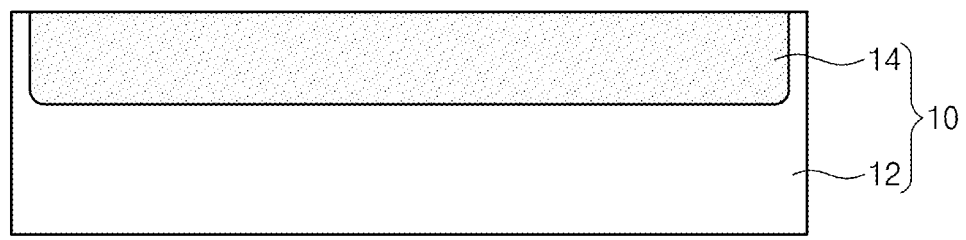
FIGS. 2 to 6 are cross-sectional views illustrating a method of manufacturing the VCSEL on the basis of FIG. 1 according to the first embodiment of the inventive concept.

Referring to FIG. 2, a first impurity layer 14 is formed in an upper portion of a silicon substrate 10. The process of forming the first impurity layer 14 may include a process of injecting first conductive type impurity ions. For example, the first impurity layer 14 may include the first conductive type impurities having a density of about $1 \times 10^{18}$ EA/cm$^3$ or more.

Figure 3:
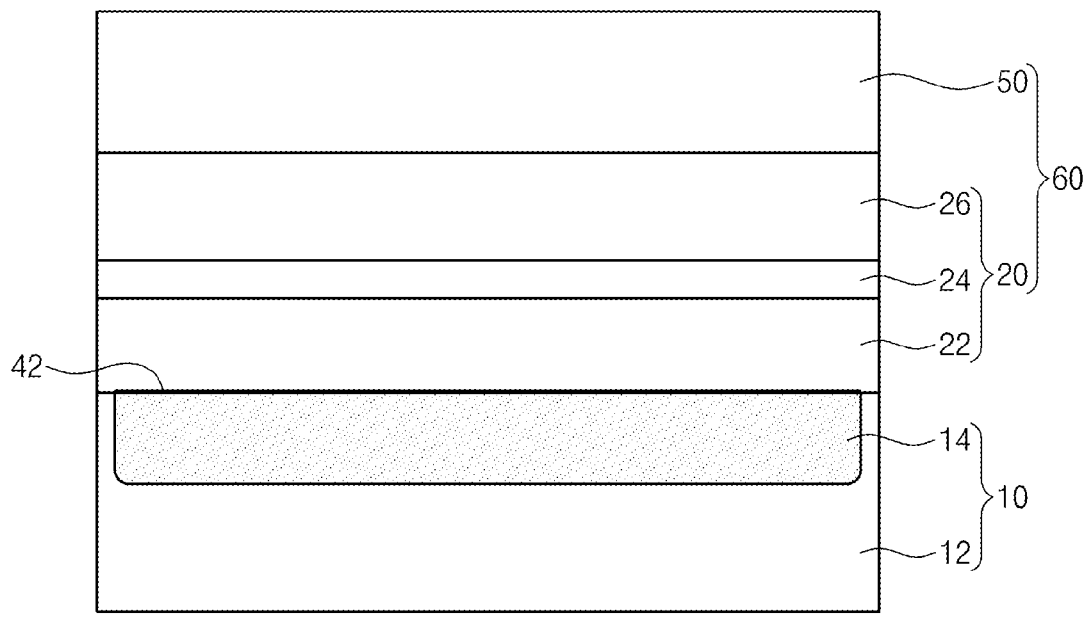

Referring to FIG. 3, a wafer 60 is bonded on the silicon substrate 10. The wafer 60 may include a III-V semiconductor substrate 50 and a III-V semiconductor light source-active layer 20 disposed on the III-V semiconductor substrate 50.

The III-V semiconductor light source-active layer 20 may include a lower reflective layer 22, a light generation layer 24, and an upper reflective layer 26.

A process of bonding the wafer 60 may include a surface activated bonding process or a hydrophobic direct bonding process. A conductive bonding interface 42 may be formed between the lower semiconductor layer 22 and the silicon substrate 10 through the bonding of the wafer 60. The bonding of the wafer 60 may efficiently and stably provide thermal and electrical resistance between the silicon substrate 10 and the III-V semiconductor light source-active layer 20. Therefore, the method of manufacturing the VCSEL according to the first embodiment of the inventive concept may improve productivity.

Figure 4:
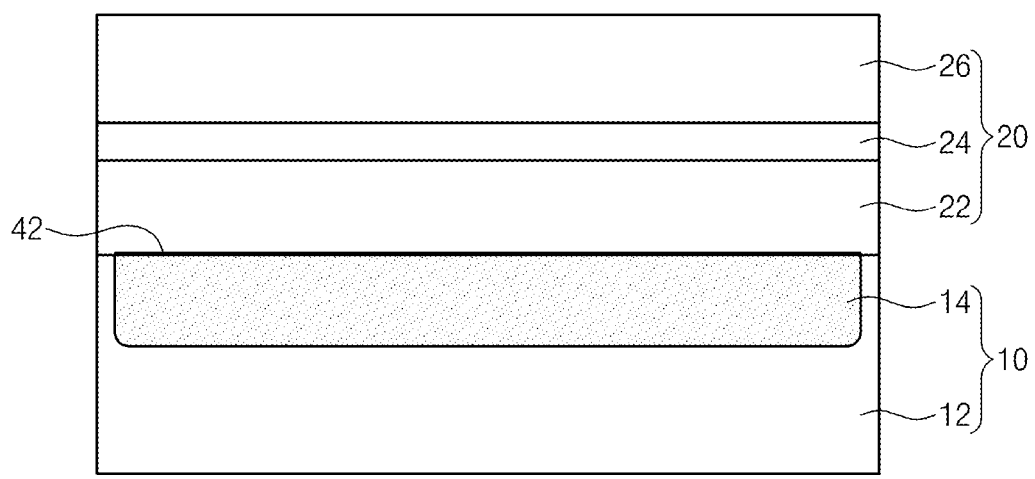

Referring to FIG. 4, the III-V semiconductor substrate 50 is removed. The process of removing the III-V semiconductor substrate 50 may include a dry etching process, a wet etching process, or a laser etching process.

Figure 5:
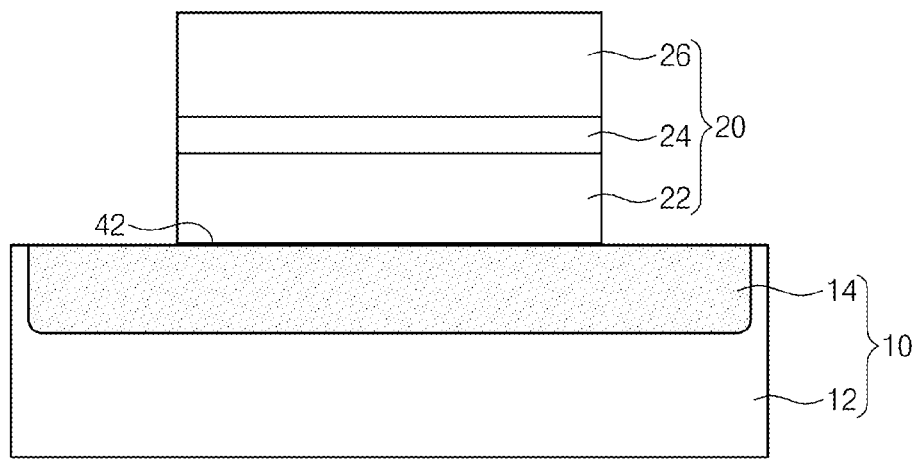

Referring to FIG. 5, the III-V semiconductor light source-active layer 20 disposed on an outer portion of the first impurity layer 14 is removed. The III-V semiconductor light source-active layer 20 may be formed on the first impurity layer 14 in a mesa shape. The process of removing the III-V semiconductor light source-active layer 20 may include photolithography and etching processes.

Figure 6:
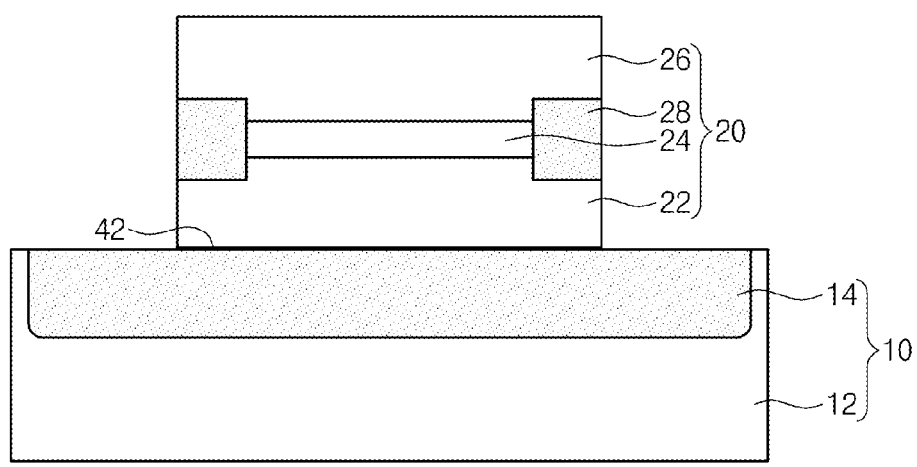

Referring to FIG. 6, an upper current aperture 28 is formed on an edge of a light generation layer 24 between the lower and upper reflective layers 22 and 26. The upper current aperture 28 may include an oxide or under cut. The oxide may be formed by a thermal treatment process after the process of removing the light source active layer 24. A portion of the light generation layer 24 having a thin film structure may quickly react with oxygen under a high-temperature environment when compared to the lower and upper reflective layers 22 and 26. Thus, the thin film layer for oxidation in the light source generation layer 24 may be quickly oxidized toward a central portion thereof during the thermal treatment process when compared to the lower and upper reflective layers 22 and 26 to form the upper current aperture 28. However, the present invention is not limited thereto. For example, the oxide may be formed by the photolithography or etching processes. The under cut may be formed by etching the light generation layer 24.

Referring again to FIG. 1, the upper and lower electrodes 34 and 32 may be formed on the upper reflective layer 26 and the first impurity layer 14, respectively. The process of forming the upper and lower electrodes 34 and 32 may include metal deposition, photolithography, and etching processes.

(Second Embodiment)

Figure 7:
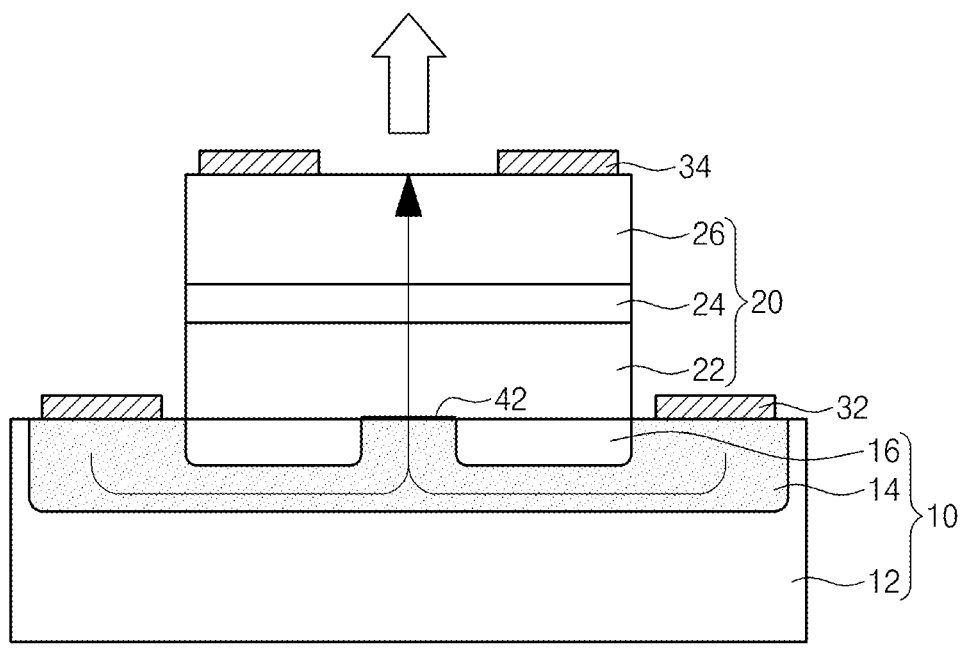
FIG. 7 is a cross-sectional view of a VCSEL according to a second embodiment of the inventive concept.

FIG. 7 is a cross-sectional view of a VCSEL according to a second embodiment of the inventive concept. The VCSEL according to the second embodiment of the inventive concept may include a second impurity layer 16 disposed between a first impurity layer 14 and a lower semiconductor layer 22. The second impurity layer 16 may be doped with first conductive type impurities. The second impurity layer 16 may be a lower aperture. The second impurity layer 16 may be disposed in an edge of an upper portion of the first impurity layer 14.

A center of a top surface of the first impurity layer 14 may have the same level as that of the second impurity layer 16. The center of the top surface of the first impurity layer 14 may be connected to the lower reflective layer 22 with a conductive bonding interface 42 therebetween. The second impurity layer 16 may have a first conductive impurity concentration lower than that of the first impurity layer 14. For example, the second impurity layer 16 may include the first conductive type impurities having a density of about $1 \times 10^{17}$ EA/cm$^3$ or less. Current may be transferred through the conductive bonding interface 42 between the first impurity layer 14 and the lower reflective layer 22.

In the second embodiment, the upper current aperture 28 of the first embodiment is omitted, and the second impurity layer 16 of the lower aperture is provided.

FIGS. 8 to 11 are cross-sectional views illustrating a method of manufacturing the VCSEL on the basis of FIG. 7 according to the second embodiment of the inventive concept.

Figure 8:
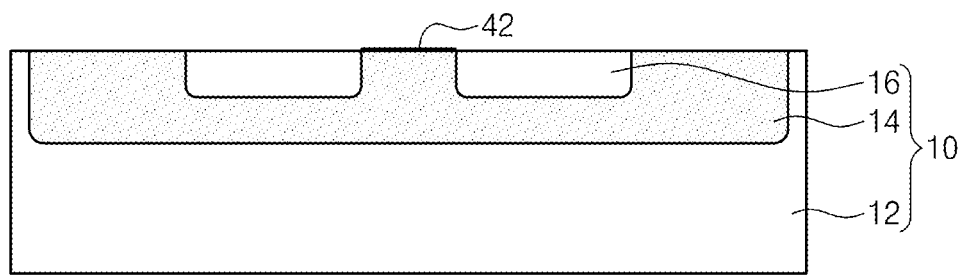
FIGS. 8 to 11 are cross-sectional views illustrating a method of manufacturing the VCSEL on the basis of FIG. 7 according to the second embodiment of the inventive concept.

Referring to FIG. 8, first and second impurity layers 14 and 16 are formed on a top surface of a silicon substrate 10. The process of forming the first and second impurity layers 14 and 16 may include a process of injecting first conductive type impurity ions. The ion injection process may be performed several times. After the first impurity layer 14 is formed, the second impurity layer 16 may be formed. First, the first conductive type impurities may be ion-injected into the silicon substrate 10 to form the first impurity layer 14. Then, the second conductive type impurities may be ion-injected into the first impurity layer 14 to form the second impurity layer 16. A portion of the first conductive type impurities in the second impurity layer 16 may be combined with the second conductive type impurities to lose the first conductive property, and the other portion of the first conductive type impurities may remain to give the first conductive property to the second impurity layer 16.

Figure 9:
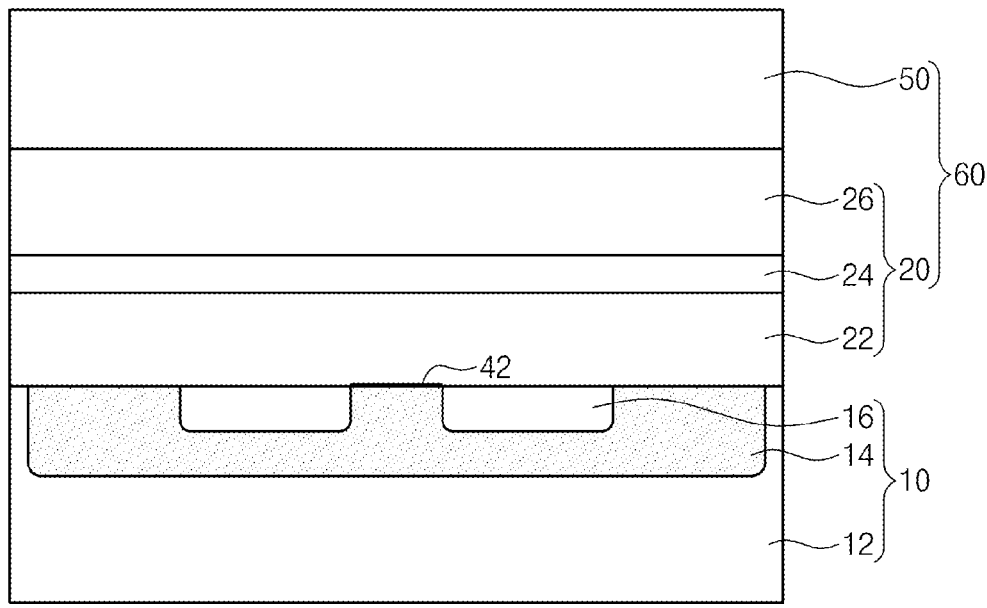

Referring to FIG. 9, a wafer 60 is bonded on the first and second impurity layers 14 and 16. The wafer 60 may include a III-V semiconductor substrate 50 and a III-V semiconductor light source-active layer 20. The III-V semiconductor light source-active layer 20 may be bonded on the first and second impurity layers 14 and 16. The III-V semiconductor light source-active layer 20 and the first impurity layer 14 may have a conductive bonding interface 42 therebetween.

Figure 10:
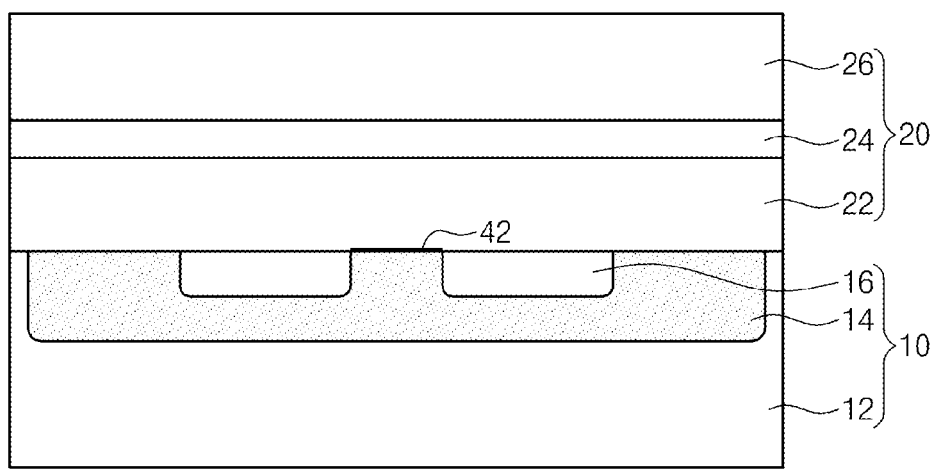

Referring to FIG. 10, the III-V semiconductor substrate 50 is removed. The process of removing the III-V semiconductor substrate 50 may include a dry etching, wet etching, or laser etching process.

Figure 11:
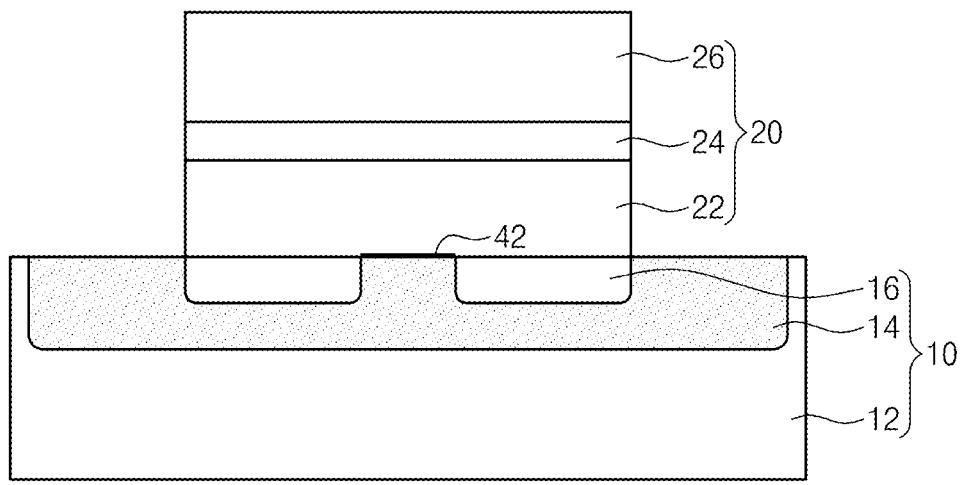

Referring to FIG. 11, the III-V semiconductor light source-active layer 20 disposed on an outer portion of the first impurity layer 14 is removed. The process of removing the III-V semiconductor light source-active layer 20 may include photolithography and etching processes. The etching process may include a dry etching or wet etching process.

Referring again to FIG. 7, upper and lower electrodes 34 and 32 may be formed on an upper reflective layer 26 and the first impurity layer 14, respectively.

(Third Embodiment)

Figure 12:
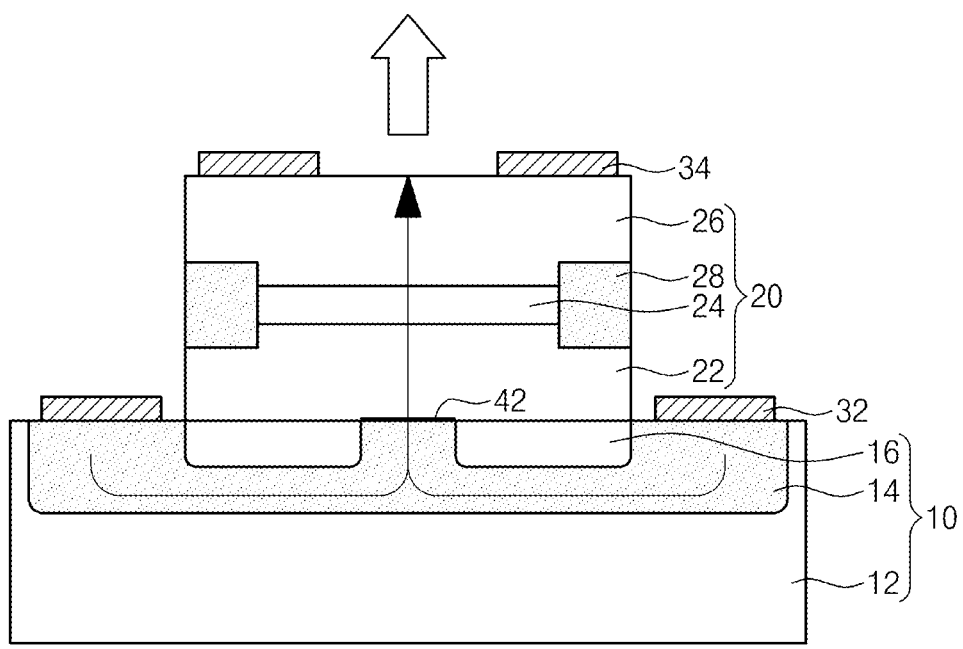
FIG. 12 is a cross-sectional view of a VCSEL according to a third embodiment of the inventive concept.

FIG. 12 is a cross-sectional view of a VCSEL according to a third embodiment of the inventive concept. The VCSEL according to the third embodiment of the inventive concept may include a second impurity layer 16 and an upper current aperture 28. The second impurity layer 16 may be disposed in a silicon substrate 10. The upper current aperture 28 may be disposed in a III-V semiconductor light source-active layer 20. The second impurity layer 16 and the upper current aperture 28 may control current flowing into the silicon substrate 10 and the III-V semiconductor light source-active layer 20, respectively. According to the third embodiment, the upper current aperture 28 of the first embodiment and the second impurity layer 16 of the second embodiment may be provided.

Figure 13:
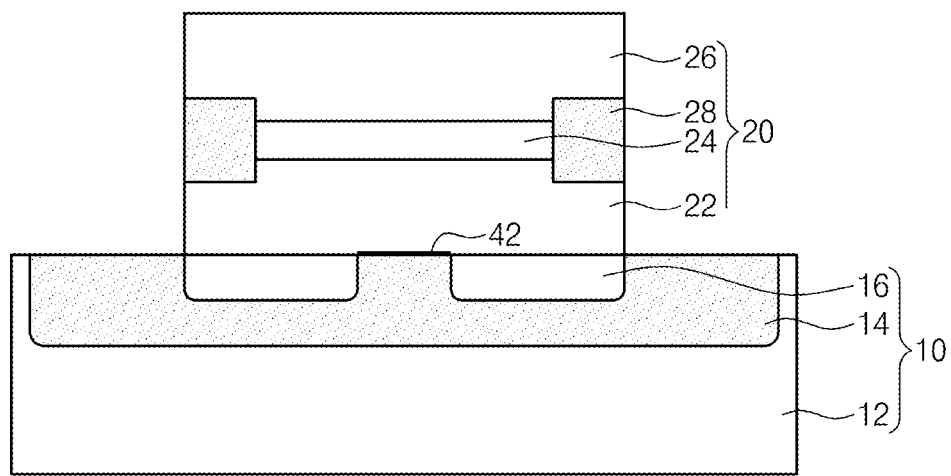
FIG. 13 is a cross-sectional view illustrating a method of manufacturing the VCSEL according to the third embodiment of the inventive concept.

FIG. 13 is a cross-sectional view illustrating a method of manufacturing the VCSEL according to the third embodiment of the inventive concept.

Referring again to FIG. 8, the first impurity layers 14 and 16 are formed on the top surface of the silicon substrate 10. The first and second impurity layers 14 and 16 may be successively formed by the ion injection process.

Referring again to FIG. 9, the wafer 60 is bonded on the first and second impurity layers 14 and 16.

Referring again to FIG. 10, the III-V semiconductor substrate 50 is removed.

Referring again to FIG. 11, the III-V semiconductor light source-active layer 20 disposed on the outer portion of the first impurity layer 14 is removed.

Referring to FIG. 13, the upper current aperture 28 is formed on the edge of the light generation layer 24.

Referring again to FIG. 12, the upper and lower electrodes 34 and 32 may be formed on the upper reflective layer 26 and the first impurity layer 14, respectively.

(Fourth Embodiment)

Figure 14:
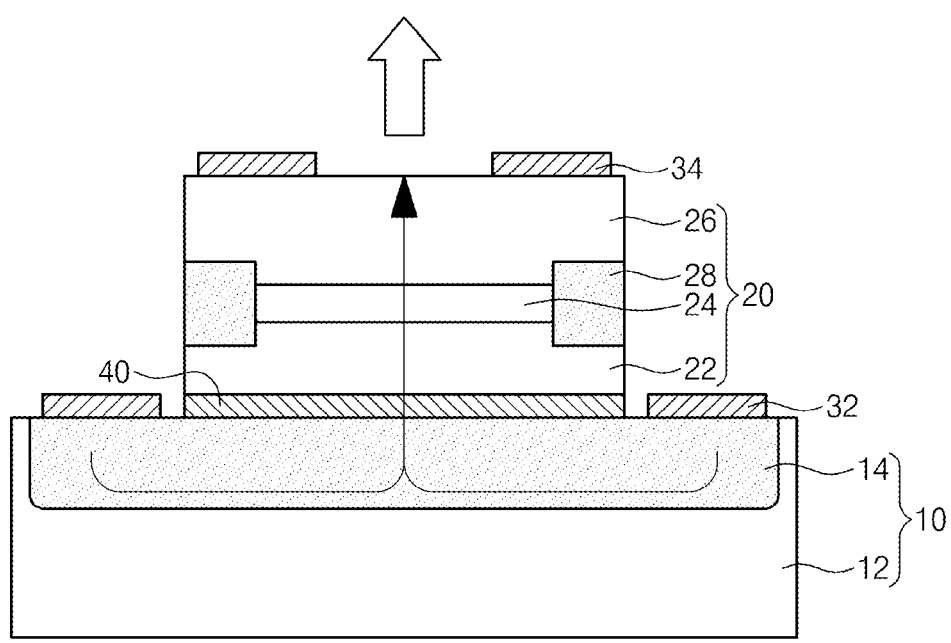
FIG. 14 is a cross-sectional view of a VCSEL according to a fourth embodiment of the inventive concept.

FIG. 14 is a cross-sectional view of a VCSEL according to a fourth embodiment of the inventive concept. The VCSEL according to the fourth embodiment of the inventive concept may include a metal bonding layer 40 between a silicon substrate 10 and a III-V semiconductor light source-active layer 20. The metal bonding layer 40 may be a bonding thin film layer. The metal bonding layer 40 and silicon substrate 10 may be bonded to each other with an ohmic contact resistance characteristic therebetween. The metal bonding layer 40 and the III-V semiconductor light source-active layer 20 may be bonded to each other with an ohmic contact resistance characteristic therebetween. Thus, the silicon substrate 10 and the III-V semiconductor light source-active layer 20 may be electrically connected to each other. In the fourth embodiment, the metal bonding layer 40 is provided between the silicon substrate 10 and the III-V semiconductor light source layer 20 of the first embodiment.

FIGS. 15 to 18 are cross-sectional views illustrating a method of manufacturing the VCSEL according to the fourth embodiment of the inventive concept.

Referring again to FIG. 2, the first impurity layer 14 is formed on the top surface of the silicon substrate 10.

Figure 15:
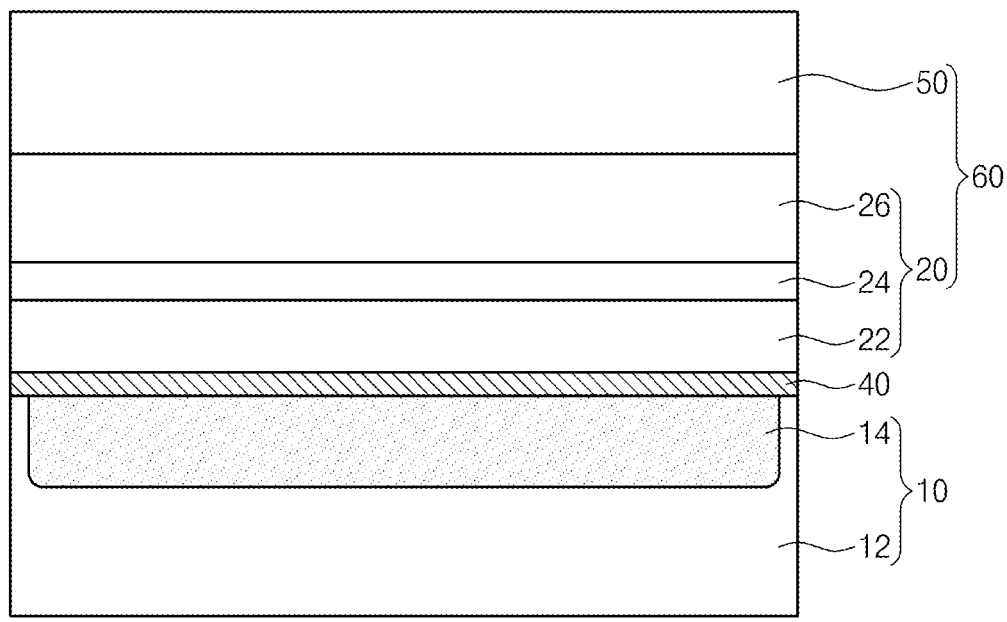
FIGS. 15 to 18 are cross-sectional views illustrating a method of manufacturing the VCSEL according to the fourth embodiment of the inventive concept.

Referring to FIG. 15, the silicon substrate 10, the metal bonding layer 40, and the wafer 60 are bonded to each other. According to the embodiment of the inventive concept, the metal bonding layer 40 may be bonded on the silicon substrate 10. The metal bonding layer 40 may be bonded on the wafer 60. However, the present invention is not limited thereto, and thus various embodiments may be applied to the present invention. For example, the metal bonding layer 40 may be bonded on each of the silicon substrate 10 and the wafer 60, and then the metal bonding layers 40 of the silicon substrate 10 and the wafer 60 may be bonded to each other. The metal bonding layer 40 may be bonded on the III-V semiconductor light source-active layer 20 of the wafer 60.

Figure 16:
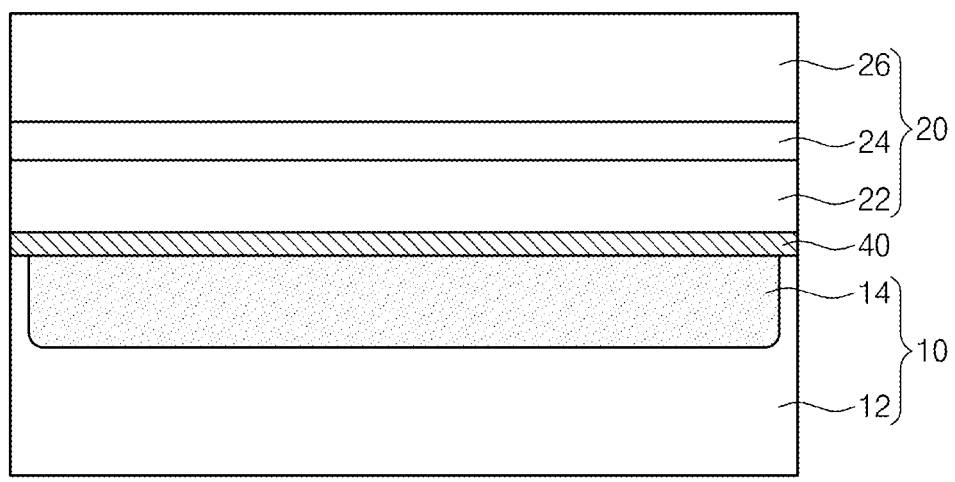

Referring to FIG. 16, the III-V semiconductor substrate 50 is removed.

Figure 17:
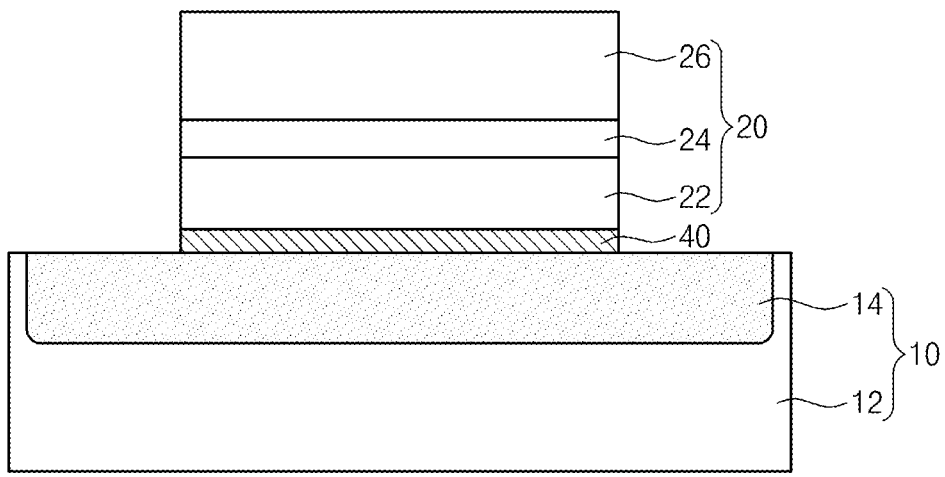

Referring to FIG. 17, the III-V semiconductor light source-active layer 20 disposed on an outer portion of the first impurity layer 14 is removed. The III-V semiconductor light source-active layer 20 may be formed in a mesa shape.

Figure 18:
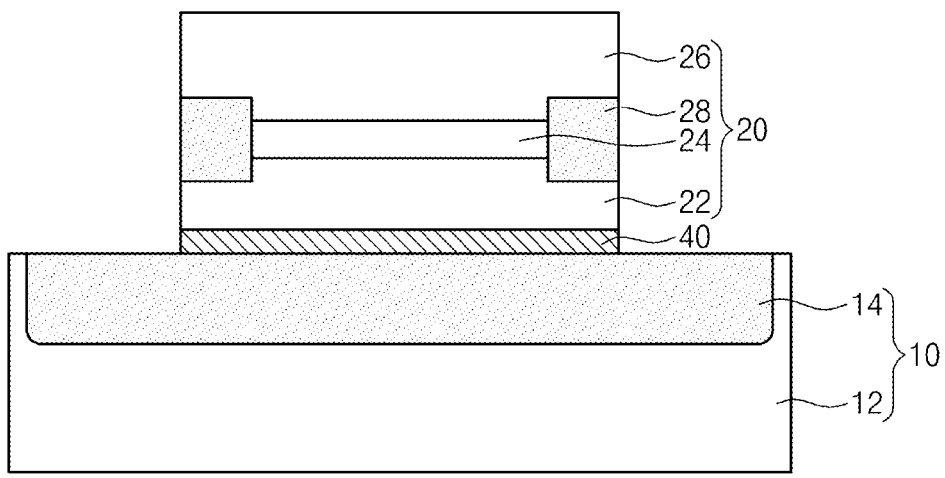

Referring to FIG. 18, an upper current aperture 28 is formed on an edge of a light generation layer 24.

Referring again to FIG. 14, upper and lower electrodes 34 and 32 may be formed on an upper reflective layer 26 and the first impurity layer 14, respectively.

As described above, the VCSEL according to the embodiments of the inventive concept may include the silicon substrate and the III-V semiconductor light source-active layer having the conductive bonding interface therebetween. The silicon substrate and the III-V semiconductor light source-active layer may be easily bonded to each other by the wafer bonding. The wafer bonding may efficiently stably provide the thermal and electrical resistance between the silicon substrate and the III-V semiconductor light source-active layer. Therefore, the VCSEL and the method of manufacturing the same according to the embodiments of the inventive concept may improve productivity.

While this invention has been particularly shown and described with reference to preferred embodiments thereof, it will be understood by those skilled in the art that various changes in form and details may be made therein without departing from the spirit and scope of the invention as defined by the appended claims. Therefore, the preferred embodiments should be considered in descriptive sense only and not for purposes of limitation.

What is claimed is:

1. A vertical-cavity surface-emitting laser (VCSEL) comprising:
    a silicon substrate comprising a bulk silicon layer and a first impurity layer disposed in the bulk silicon layer;
    a semiconductor light source-active layer comprising a lower reflective layer disposed on the silicon substrate, a light generation layer disposed on the lower reflective layer, and an upper reflective layer disposed on the light generation layer; and
    a lower current aperture disposed within the first impurity layer and disposed under a bottom surface of the lower reflective layer disposed on the first impurity layer,
    wherein the first impurity layer and the lower reflective layer directly contact each other,
    wherein the first impurity layer comprises first conductive type impurities doped in the silicon substrate, and
    wherein the lower reflective layer has the same conductive type as that of the first impurity layer.

2. The VCSEL of claim 1, wherein the lower current aperture comprises a second impurity layer having a concentration of the first conductive type impurities lower than a concentration of the first conductive type impurities in the first impurity layer.

3. The VCSEL of claim 1, wherein the light generation layer comprises an upper current aperture disposed in an edge portion thereof between the lower reflective layer and the upper reflective layer.

4. The VCSEL of claim 3, wherein the upper current aperture comprises an oxide material and the upper current aperture is disposed in a portion horizontally recessed from a sidewall of the semiconductor light source-active layer.

5. The VCSEL of claim 1, further comprising:
    a lower electrode disposed on the first impurity layer outside the lower reflective layer; and
    an upper electrode disposed on the upper reflective layer.

6. A method of manufacturing a VCSEL, the method comprising:
    providing a silicon substrate;
    forming a first impurity layer in an upper portion of the silicon substrate;
    bonding a wafer comprising a semiconductor substrate and a semiconductor light source-active layer disposed on the semiconductor substrate to the silicon substrate such that the semiconductor light source-active layer is disposed on the silicon substrate;
    removing the semiconductor substrate;
    patterning the semiconductor light source-active layer to form a lower reflective layer, a light generation layer, and an upper reflective layer; and forming a lower current aperture within the first impurity layer and under a bottom surface of the lower reflective layer disposed on the first impurity layer, wherein the first impurity layer and the lower reflective layer directly contact each other.

7. The method of claim 6, wherein the bonding of the wafer comprises performing a surface activated bonding process or a hydrophobic direct bonding process.

8. The method of claim 6, wherein the patterning of the semiconductor light source-active layer further comprises forming an upper current aperture in an edge portion of the light generation layer and between the lower reflective layer and the upper reflective layer.

9. The method of claim 6, wherein forming the lower current aperture comprises forming a second impurity layer having a concentration of first conductive type impurities lower than a concentration of the first conductive type impurities in the first impurity layer.

10. The VCSEL of claim 1, wherein the lower current aperture includes first and second portions, wherein the first and second portions of the lower current aperture include the first conductive type impurities having a lower concentration than that of the first impurity layer, wherein the first and second portions of the lower current aperture are disposed under the bottom surface of the lower reflective layer, and wherein a portion of the first impurity layer is disposed between the first and second portions of the lower current aperture and has a top surface being level with an interface between the first impurity layer and the lower reflective layer.

11. The VCSEL of claim 2, wherein the concentration of the first conductive type impurities in the first impurity layer is not less than $1*10^{18}$ EA/cm$^3$, and the concentration of the first conductive type impurities in the second impurity layer is not greater than $1*10^{17}$ EA/cm$^3$.

12. The method of claim 9, wherein forming the second impurity layer includes ion-injecting second conductive type impurities into a portion of the first impurity layer doped with the first conductive type impurities.

* * * * *